United States Patent [19]

Levinson

[11] Patent Number: 5,923,206
[45] Date of Patent: Jul. 13, 1999

[54] CHARGE INJECTION CANCELLATION TECHNIQUE

[75] Inventor: Roger A. Levinson, Sunnyvale, Calif.

[73] Assignee: Exar Corporation, Fremont, Calif.

[21] Appl. No.: 08/827,284

[22] Filed: Mar. 27, 1997

[51] Int. Cl.[6] .................................................. G06G 7/12
[52] U.S. Cl. .......................... 327/362; 327/560; 330/84;
330/109; 330/294; 330/302
[58] Field of Search .................................. 327/333, 362,
327/382, 337, 560, 562; 330/77, 84, 85,
109, 97, 120, 121, 271, 294, 302

[56] References Cited

U.S. PATENT DOCUMENTS

| | | | |
|---|---|---|---|
| 3,707,685 | 12/1972 | Geffe | 330/21 |
| 4,301,419 | 11/1981 | Calomiris | 330/107 |
| 4,401,855 | 8/1983 | Broderson et al. | 704/219 |
| 4,558,292 | 12/1985 | Sasaki et al. | 333/173 |
| 5,084,639 | 1/1992 | Ribner | 327/311 |
| 5,180,930 | 1/1993 | Mayes | 327/94 |
| 5,229,772 | 7/1993 | Hanlon | 341/172 |
| 5,363,055 | 11/1994 | Ribner | 330/9 |
| 5,635,871 | 6/1997 | Cavigelli | 330/107 |
| 5,745,002 | 4/1998 | Baschirotto et al. | 327/554 |

*Primary Examiner*—Terry D. Cunningham
*Attorney, Agent, or Firm*—Townsend and Townsend and Crew LLP

[57] ABSTRACT

An MOS FET circuit with a summing circuit at the input of an amplifier to provide charge cancellation. The summing circuit is capacitively coupled to the input with a charge cancellation capacitor. A separate amplifier, having components substantially the same as the components of the first amplifier, is connected through the charge cancellation capacitor to the first amplifier.

6 Claims, 4 Drawing Sheets

Charge Cancellation Circuit

Dummy, Common Node Path

CHARGE INJECTION CANCELLATION TECHNIQUE

BACKGROUND OF THE INVENTION

The present invention relates to techniques for eliminating clock feedthrough (charge injection) in MOS FET switched capacitor amplifier circuits.

A practical problem with MOS FET's is their parasitic capacitances. Unwanted capacitances can affect the FET's ability to perform optimally under certain conditions. These conditions mainly deal with situations where the FET is required to operate with large and fast input changes, i.e., during switched operation. The switched capacitor amplifier circuit used widely for Analog-to-Digital (ADCs) conversion is an example. A simplified functional example is shown in FIG. 1A.

As shown in FIG. 1A, the circuit is made up of an inverting amplifier with capacitor ($C_f$) shunted by a switch. Capacitor $C_f$ provides the output to input feedback required to control the closed loop gain of the amplifier. In bipolar amplifiers such feedback is most likely to be provided by a resistive element. However, in CMOS design a capacitive element is generally preferred. The use of a capacitor in the feedback loop is also the basic building block for a integrator circuit. To keep the capacitor from accumulating a charge or integrating, a switch is placed across the feedback capacitor. This switch periodically dumps the charge across the capacitor. The incoming clock rate is set fast enough to keep the circuit from integrating. As such, a basic closed loop gain stage is created. The basic FET implementation of the switched capacitor amplifier circuit is shown in FIG. 1B. The switched component has been changed to a FET type device. Due to the closeness (separation by a dielectric material) and the size of the elements (gates, drains and sources), the FET transistor exhibits parasitic capacitances that can become a problem in switched applications. This is shown as Cgd (capacitance gate to drain) and Cgs (capacitance gate to source) in FIG. 1B. As long as the switch remains in the open or closed position this capacitance causes negligible circuit performance problems. However when the clock transitions, the charge voltage requirement across the capacitor changes and a small current flows as a result. Generally an equal portion of this current flows in both the source and drain of the switched component (FET 2X). The unwanted effect of this current is known as clock feedthrough or as charge injection. Both terms will be used universally in this discussion.

Given the high FET circuit impedance's, $I_{parasitic}$ (in the figure) can produce an output error with considerable magnitude (a few tenths of a volt). Such an error may not be acceptable in some applications. Several methods have been devised to deal with clock feedthrough or charge injection as discussed above. Two of these solutions are presented in FIG. 2A and FIG. 2B. FIG. 2A's solution is quite simple. In this scheme an inverted clock is provided to the gate of a second FET identified as 1X. The source and drain of this device are connected together and tied to one side of the 2X FET. When the clock signal to the 2X FET goes low, a charge injection current occurs through the stray capacitance of Cgd. This charge injection results in a current flow toward capacitor $C_{in}$. However, at the same time an inverted clock to the 1X FET goes high. The high going signal at the gate of the 1X FET causes a current to flow toward the 1X FET to charge its gate to drain and gate to source stray capacitances. In the process it siphons current that was leaving the 2X FET due to 2X's charge injection. This process therefore provides a cancellation effect through the promotion of opposite charge injections. As the 1X FET uses an inverted version of the same clock, the same clock timing relationship exists for both devices, i.e., both 1X and 2X elements act together simultaneously. The 1X FET could be viewed as a capacitor connected to a voltage that stays in reverse polarity to that of the 2X FET. To be fully functional the 1X FET would have to be designed to subtract or add the same charge injection current as that added or subtracted by the 2X FET, respectively. The major concern is any feedthrough current that appears at the input of the inverting amplifier. Therefore, the 1X FET only needs to address the 2X drain feedthrough current being generated by the 2X gate to drain parasitic capacitance. The parasitic capacitance of a FET is determined mainly by its area. Given that both the source and drain are active in the 1X FET, the 1X FET needs to be one half the area of the 2X FET. In this case the nomenclature 1X and 2X actually reflect the areas of the FETs, i.e., the 1X FET is half as large as the 2X FET.

Another clock feedthrough cancellation method is shown in FIG. 2B. In this scheme a clock of the same phase is fed to two similar inverting stages. The lower stage in the figure is a dummy stage, i.e., it doesn't have a real signal input. Its function is simply to manufacture a second dummy charge injection. The dummy signal and the real signal with its unwanted charge injection are fed to a summing circuit. The signal stage (top) is connected to the positive side of the summer, whereas the dummy charge injection signal is connected to the negative side of the summer. As the same clock is used in both inverters, the same charge injection signal will be generated in each circuit. The dummy's output, however, is seen at the subtractive input of the summer. The dummy output will therefore subtract or cancel the positive clock feedthrough signal. The process has been made overly simple for this presentation. Actually the process can become much more complex. For example, in order to cancel the charge injection completely both the signal and dummy stages must work perfectly together. The traditional method shown in FIG. 2A provides only a coarse cancellation and requires two clocks. It is difficult to obtain the correct ratio of 1X to 2X due to manufacturing process variations. These process variations can result in only partial cancellation of the charge injection or clock feedthrough. Such manufacturing variations can result in cancellation of 70% to 80%. The method shown in FIG. 2B is both difficult and expensive to implement. Not only does it duplicate the basic signal components, but it also requires a relatively complex and expensive summer circuit. The summer can be slow and introduce additional errors such as offset.

SUMMARY OF THE INVENTION

The present invention provides an MOS FET circuit with a summing circuit at the input of an amplifier to provide charge cancellation. The summing circuit is capacitively coupled to the input with a charge cancellation capacitor. A separate amplifier, having components substantially the same as the components of the first amplifier, is connected through the charge cancellation capacitor to the first amplifier.

Preferably, the input of the second amplifier is grounded. It has a switching FET transistor across its capacitor which is controlled by the same clock signal as the switching FET transistor of the first amplifier. The present invention allows the use of amplifiers with simple, single-ended, low open loop gain inverters.

For further understanding of the nature and advantages of the invention, reference should be made to the following description taken in conjunction with the accompanying drawings.

DETAILED DESCRIPTION OF PREFERRED EMBODIMENT

Figure 1A:
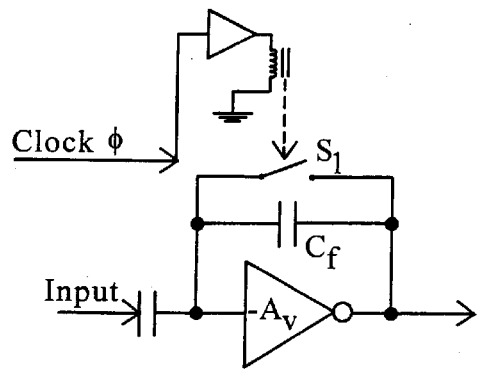
FIGS. 1A and 1B illustrate the concept of a switched capacitor amplifier and the generated parasitic capacitances.
Figure 1B:
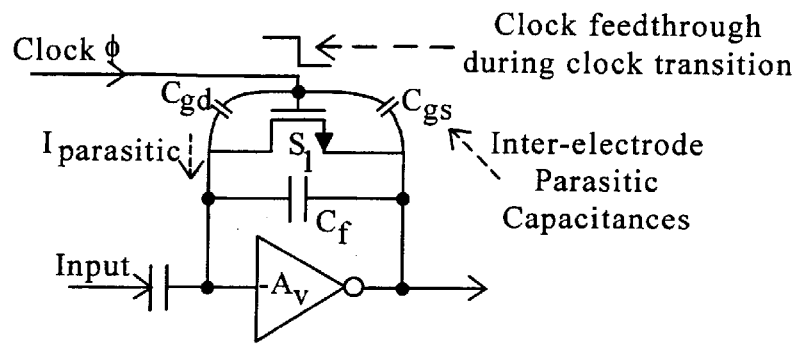
Figure 2A:
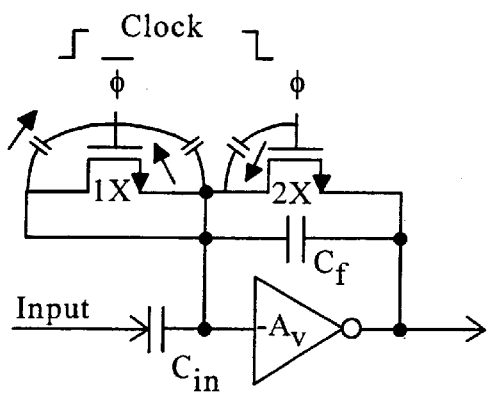
FIGS. 2A and 2B illustrate two prior art approaches to cancellation of clock feedthrough or charge injection.
Figure 2B:
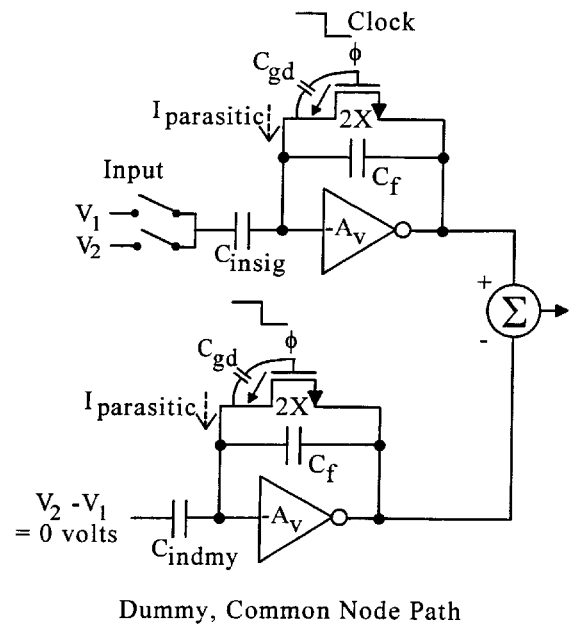
Figure 3:
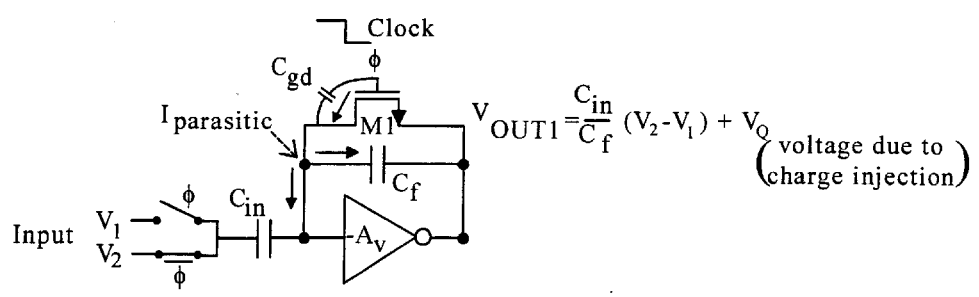
FIG. 3 is a diagram illustrating the voltage and currents arising as a result of charge injection or clock feedthrough.

FIG. 3 depicts the basic charge injection Clock Feedthrough problem. As shown in FIG. 3, a parasitic current is created by the transition of the clock to M1's gate. A voltage $V_Q$ is generated at the input to A1 due to a small parasitic current that flows in the very high impedance FET circuit, i.e., $V_Q = I_{parasitic} \times R_{in}$. A voltage ($V_Q$) generated at the input to A1 will influence A1's output ($V_{OUT}$) in accordance with the gain. If A1's gain is high, the majority of the current flows through $C_F$ and the effect at the output of A1 is minimal. However if the gain of A1 is low, often the case for a FET inverter, a larger amount of current will flow in $C_{in}$. In this case A1's input and therefore output will be affected. This can also be seen in the formula for A1's output as follows.

$$V_{OUT} = -\left(\frac{C_{in} \cdot A}{C_{in} + (1+A)C_f}\right) \cdot (V_2 - V_1) + \left(\frac{A}{C_{in} + (1+A)C_f}\right) \cdot Q_{inj}$$

Where Q is the charge injected by the clock feedthrough. For large values of A, $V_{OUT}$ is approximately equal to $$\frac{Q_{inj}}{C_f} - \frac{C_{in}}{C_f}(V_2 - V_1)$$

Let $V_Q$ represent the output voltage component due to charge injection, $Q_{inj}$.

Figure 4:
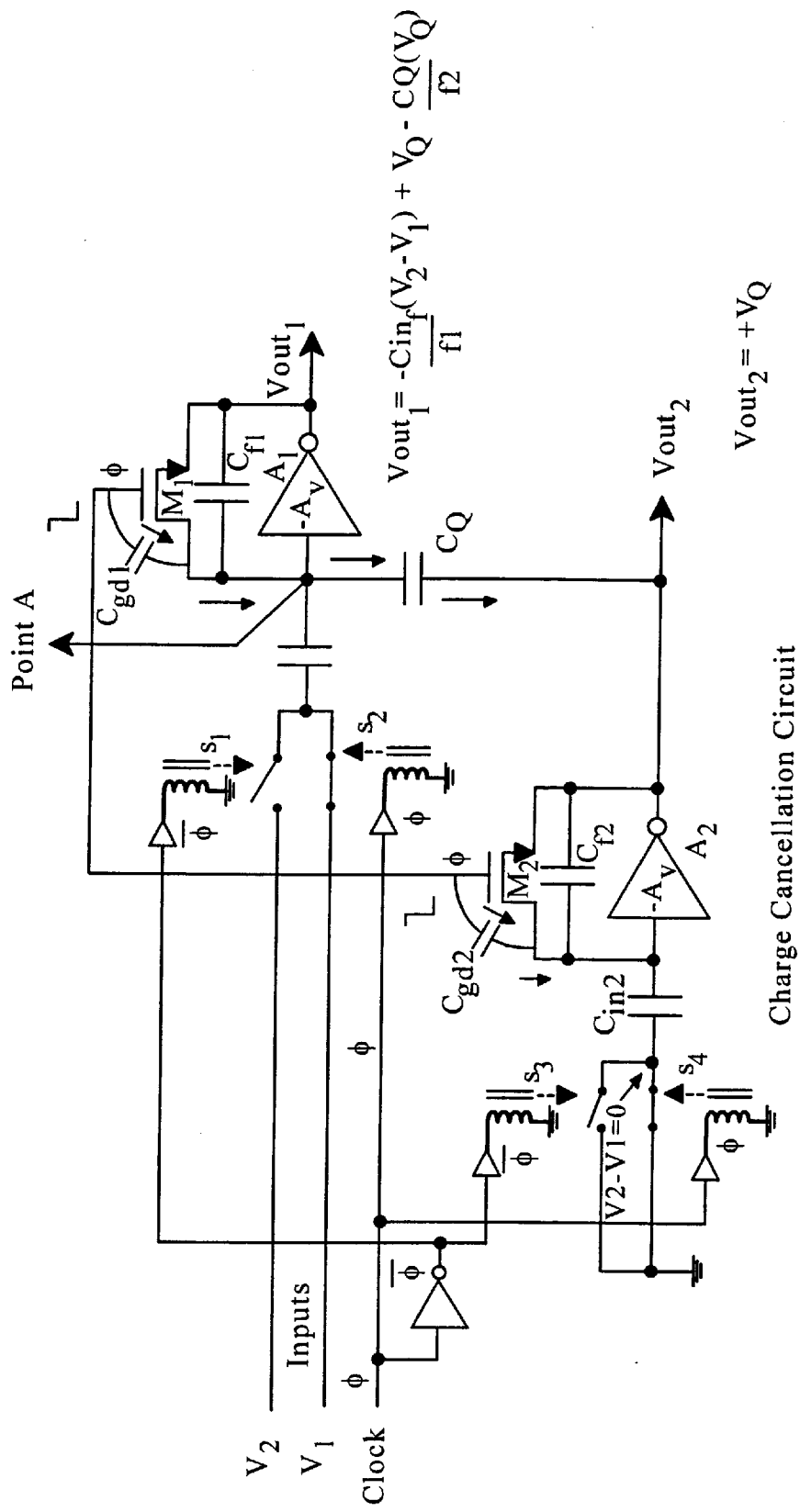
FIG. 4 is a diagram of one embodiment of a circuit according to the present invention.

The solution to remedy the clock feedthrough (charge injection) problem according to the present invention is straight forward and uses inexpensive, simple to build inverter components. A simplified functional diagram is shown in FIG. 4. Instead of providing a separate summer to handle the outputs of the signal and charge cancellation circuits, a summer is created at the input of the signal carrying stage. This summing circuit is created by capacitively connecting the charge cancellation circuit to the input of the signal carrying stage through a capacitor $C_Q$. Given the following scenario with a defined starting point in time, the circuits function can be described as follows.

Assume that the clock theta (non-inverted clock) to M1 and M2 in the figure are high, but are about to go low. Prior to going low both M1 and M2 are both turned on. When the clock theta switches low both M1 and M2 turn off. As M1 and M2 turn off, their channel charge flows out through their sources and drains. Since both M1 and M2 are operating in identical circuits, the amount of charge that flows out of both their drains will match very well. Their drain charges will inject into the input nodes of both A1 and A2 nearly identically. Therefor, the output of A2 due to charge injection will match the output of A1 due to charge injection.

The output of A2 is inverted before being applied to the input of A1 through capacitor $C_Q$. The inversion results in a 180 degree phase shift of the charge injection voltage generated at A2.

As stated, A1's charge injection voltage will result in current moving toward point A in FIG. 4. A2's charge injection voltage, however, results in current moving away from point A toward the plates of $C_Q$. The result is that A2's charge injection will cancel part or all of A1's charge injection. To completely cancel A1's charge injection the output of A2 must generate an equal charge cancellation current at point A in FIG. 4.

This concept can be summarized as follows. The input side of $C_{in2}$ can be connected as shown in the figure or simply connected to ground. In either case the signal component will be zero. As there is no signal component, A2's output will be $V_Q$.

Having defined the output of A2, the output of A1 is simply the sum of the $C_{in1}$ and $C_Q$ inputs. This can be defined as follows.

$$V_{OUT_1} = -\frac{C_{in_1}}{C_{f_1}}(V_2 - V_1) + V_Q - \frac{C_Q}{C_{f_1}}(V_Q)$$

Note that A1's input from the charge cancellation circuit is negative. As a result the charge injection voltage ($V_Q$) from A2 will provide a cancelling effect at A1. The value of the charge cancellation ($V_C$) is determined by the gain components of the combined circuits. If A2 is to have a charge cancellation equal to A1's charge injection, then the gains of A1 and A2 should be the same or $C_{f2}$ and $C_{f1}$ are made equal. $C_Q$ and $C_f$ determine the gain for the charge injection voltage ($V_Q$) as seen at the input of A1. If $C_Q$ and $C_{f1}$ are selected such that they provide a quotient of one, then the charge injection of A1 will be cancelled by the charge injection of A2. As the charge injection of A1 and the charge injection of A2 now cancel, the resultant formula can be rewritten as follows.

$$V_{OUT_1} = -\frac{C_{in_1}}{C_{f_1}}(V_2 - V_1)$$

Making the value of $C_f$ equal to $C_Q$ works well for amplifier configurations with high open loop gain. However some FET inverters may exhibit gains of only 20 or 30. Under these reduced gain conditions the ideal transfer function of $C_{in}$ divided by $C_f$ becomes more dependent upon the open loop gain. Under low gain conditions it is necessary to adjust the ratio of $C_Q$ and $C_f$ to achieve complete cancellation.

Figure 5:
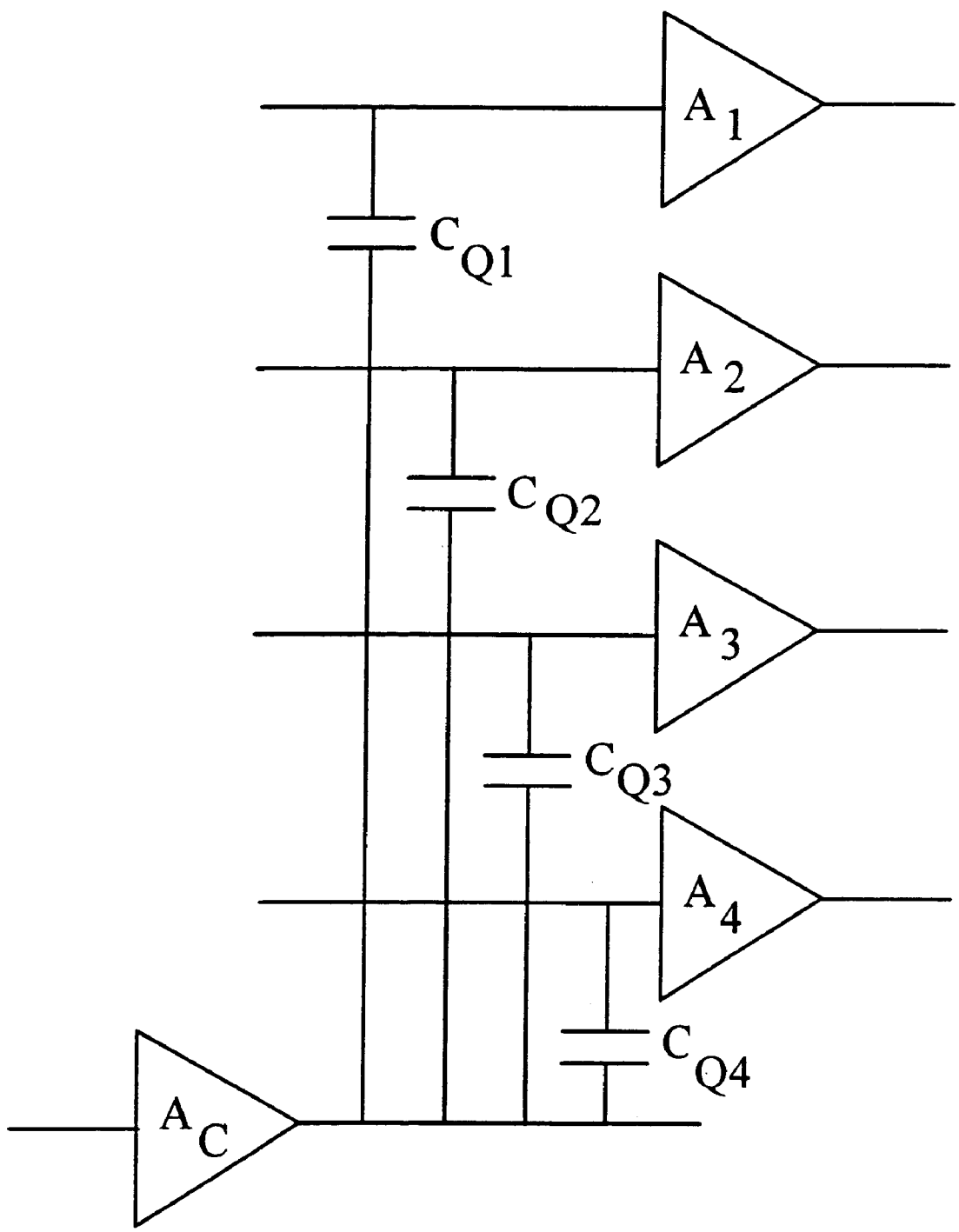
FIG. 5 is a diagram of the present invention used for multiple amplifiers.

FIG. 5 illustrates an alternate embodiment of the present invention in which a single cancellation amplifier, AC, is coupled to multiple amplifiers A1–A4. Each amplifier A1–A4 has an associated cancellation capacitor, $C_{Q1}$–$C_{Q4}$ associated with it, and coupled between the input of such amplifier and the output of cancellation amplifier $A_C$. Such an arrangement might be used, for instance, where the amplifiers are formed in multiple pipeline stages of analog-to-digital converters such as shown in U.S. Pat. No. 5,572,212. Alternately, a single compensating amplifier can be used for all the amplifiers in each stage of the analog-to-digital converter with a separate compensating amplifier for each stage.

As will be understood by those of skill in the art, the present invention may be embodied in other specific forms without departing from the spirit or essential characteristics thereof. Accordingly, the foregoing description is meant to illustrate, but not limit, of the scope of the invention which is set forth in the following claims.

What is claimed is:

1. A charge injection cancellation circuit comprising:

a first switched capacitor MOS FET amplifier;

a charge cancellation capacitor having a first node coupled to an input of said first amplifier; and a second switched capacitor MOS FET amplifier having an output coupled to a second node of said charge cancellation capacitor, said second amplifier having components substantially the same as components of said first amplifier;

wherein said second amplifier has an input coupled to ground, and wherein both said first and second amplifiers have a switching FET transistor coupled to the same clock signal;

such that charge injection through said switching FET transistor in said first amplifier is substantially cancelled by charge injection in said second amplifier.

2. The circuit of claim 1 wherein each of said amplifiers is constructed with a single-ended inverter, with an open loop gain less than 40.

3. The circuit of claim 1 wherein said first amplifier includes a switched feedback capacitor ($C_f$), and the value of said charge cancellation capacitor ($C_Q$) is chosen to be equal to the value of said switched feedback capacitor.

4. The circuit of claim 1 further comprising:

a plurality of additional amplifiers;

a plurality of additional charge cancellation capacitors, each charge cancellation capacitor having a first node coupled to one of said plurality of additional amplifiers, and a second node coupled to said output of said second amplifier.

5. The circuit of claim 1 wherein each of said amplifiers comprises:

an inverter having an input and an output;

a first capacitor coupled between said input and said output of said inverter;

an MOS FET transistor coupled across said first capacitor;

a second capacitor coupled to said input of said inverter; and a clock coupled to a gate of said transistor.

6. A charge injection cancellation circuit comprising:

a first switched capacitor MOS FET amplifier including an inverter having an input and an output, a first capacitor coupled between said input and said output of said inverter, a first MOS FET transistor coupled across said first capacitor, and a second capacitor coupled to said input of said inverter;

a third, charge cancellation capacitor having a first node coupled to an input of said first amplifier; and a second switched capacitor MOS FET amplifier, said second amplifier having components substantially the same as components of said first amplifier, said second amplifier including a second inverter having an input and an output, said output being coupled to a second node of said charge cancellation capacitor, a fourth capacitor coupled between said input and said output of said inverter, a second MOS FET transistor coupled across said first capacitor, and a fifth capacitor coupled to said input of said inverter;

wherein said second amplifier has an input coupled to ground, and wherein both said first and second amplifiers have a switching FET transistor coupled to the same clock signal;

wherein each of said amplifiers is constructed with a single-ended inverter, with an open loop gain less than 40;

such that charge injection through said first MOS FET transistor in said first amplifier is substantially cancelled by charge injection through said second MOS FET transistor in said second amplifier.

* * * * *